United States Patent
Ha et al.

(10) Patent No.: US 11,653,496 B2
(45) Date of Patent: May 16, 2023

(54) ASYMMETRIC JUNCTIONS OF HIGH VOLTAGE TRANSISTOR IN NAND FLASH MEMORY

(71) Applicant: Intel Corporation, Santa Clara, CA (US)

(72) Inventors: Chang Wan Ha, San Ramon, CA (US); Chuan Lin, Cupertino, CA (US); Deepak Thimmegowda, Fremont, CA (US); Zengtao Liu, Eagle, ID (US); Binh N. Ngo, Folsom, CA (US); Soo-yong Park, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 302 days.

(21) Appl. No.: 17/032,239

(22) Filed: Sep. 25, 2020

(65) Prior Publication Data

US 2022/0102365 A1    Mar. 31, 2022

(51) Int. Cl.
*H01L 27/11*      (2006.01)
*H01L 27/1158*    (2017.01)
*H01L 29/10*      (2006.01)
*G11C 16/04*      (2006.01)

(52) U.S. Cl.
CPC ...... *H01L 27/1158* (2013.01); *G11C 16/0466* (2013.01); *G11C 16/0483* (2013.01); *H01L 29/1033* (2013.01)

(58) Field of Classification Search
CPC ............. H01L 27/1158; H01L 29/1033; H01L 27/11546; H01L 27/11524; H01L 27/11551; H01L 27/1157; H01L 27/11578; G11C 16/0466; G11C 16/08; G11C 16/0483; G11C 2211/5621; G11C 11/5628; G11C 11/5635; G11C 11/5642
See application file for complete search history.

(56) References Cited

U.S. PATENT DOCUMENTS

| | | | |
|---|---|---|---|
| 2006/0030102 A1* | 2/2006 | Lee | H01L 27/11526 438/257 |
| 2008/0185634 A1* | 8/2008 | Li | H01L 27/11573 257/E21.679 |
| 2009/0180333 A1* | 7/2009 | Yamada | G11C 16/26 365/185.25 |
| 2010/0059813 A1* | 3/2010 | Sugi | H01L 27/11568 257/326 |
| 2012/0020157 A1* | 1/2012 | Lee | H01L 27/11546 257/E21.409 |
| 2013/0001686 A1* | 1/2013 | Kim | H01L 29/78 257/E29.256 |
| 2016/0104537 A1* | 4/2016 | Chang | H01L 29/1033 365/185.29 |

(Continued)

OTHER PUBLICATIONS

The Art of Analog Layout, Alan Hastings, Prentice Hall, pp. 403-405, 2001 (Year: 2001).*

*Primary Examiner* — S M Sohel Imtiaz
(74) *Attorney, Agent, or Firm* — Compass IP Law, PC (57) ABSTRACT

The total silicon area used by a plurality of high voltage transistors in an array of NAND cells is reduced by modifying the silicon area layout such that the size of the source and drain of each of the plurality of high voltage transistors is dependent on the maximum voltage to be applied to each of the source and drain for the respective one of the plurality of high voltage transistors.

15 Claims, 9 Drawing Sheets

(56) References Cited

U.S. PATENT DOCUMENTS

2016/0104712 A1* 4/2016 Hsu .................. H01L 27/10897
                                                         257/656
2018/0151223 A1* 5/2018 Torti .................... G11C 13/004
2021/0057028 A1* 2/2021 Hosomura ............... G11C 8/12

* cited by examiner

|     | Read (page) | Program (page) | Erase (block) |
| --- | --- | --- | --- |
| SGD | 2V | 1.5V | 14V - 16V |
| WL3 | 6V | 10V | 0V |
| WL2 | 0~5V | 10V | 0V |
| WL1 | 6V | 20V | 0V |
| WL0 | 6V | 10V | 0V |
| SGS | 6V | 10V | 14V - 16V |
| SRC | 0V | 2V | 18V - 20V |
| B/L | 0V~0.5V | 2V/0V | 18V - 20V |

ASYMMETRIC JUNCTIONS OF HIGH VOLTAGE TRANSISTOR IN NAND FLASH MEMORY

FIELD

This disclosure relates to non-volatile memory devices and in particular to NAND Flash memory devices.

BACKGROUND

Non-volatile memory refers to memory whose state is determinate even if power is interrupted to the device. Storage devices that include non-volatile memory include a secure digital card, a multimedia card, a flash drive (for example, a Universal Serial Bus (USB) flash drive also known as a "USB thumb drive" or "USB memory stick" that includes non-volatile memory with an integrated USB interface), and a solid-state drive. The non-volatile memory can comprise a block addressable memory device, such as NAND, or more specifically, multi-threshold level NAND Flash memory (for example, Single-Level Cell ("SLC"), Multi-Level Cell ("MLC"), Quad-Level Cell ("QLC"), Tri-Level Cell ("TLC"), or some other NAND). The NAND Flash cell uses the threshold voltage of a floating-gate transistor to represent the data stored in the cell.

NAND Flash memory devices typically use a one-transistor memory cell that allows for high memory densities, high reliability, and low power consumption. Memory cells are typically arranged in a memory array and are addressable with a row/column format. Data lines used to transfer signals to/from the various memory cells can be coupled to low-voltage circuitry that may be configured to handle relatively low voltages, such as logic or data cache circuitry. The low-voltage circuitry provides relatively low voltages (for example, about 1 to 3 volts) to the data lines during read or write operations with one or more selected memory cells.

During an erase operation in the NAND Flash memory devices, memory cells may be erased a block at a time by grounding all of the access lines in the block while allowing the data lines to float. A relatively high erase voltage (for example, about 12 to 30 volts) is applied to the channels of the memory cells to remove charge from the storage structure of each memory cell in that block.

BRIEF DESCRIPTION OF THE DRAWINGS

Features of embodiments of the claimed subject matter will become apparent as the following detailed description proceeds, and upon reference to the drawings, in which like numerals depict like parts, and in which:

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined as set forth in the accompanying claims.

DESCRIPTION OF EMBODIMENTS

Three Dimensional (3D) NAND is a type of non-volatile flash memory in which memory cells are stacked vertically in multiple layers. For example, 32, 48, 64 or more cell layers can be stacked vertically. As the number of layers increases there is a corresponding increase in global word line drivers that results in an increase in silicon area in the 3D NAND integrated circuit.

A global word line driver in a 3D NAND integrated circuit includes a high voltage (HV) transistor that includes a source, gate and drain. The voltage on the drain can vary from 0 Volts to about 20 Volts. The voltage on the source can vary from 0 Volta to about 20V if the voltage on the gate of the HV transistor is 4 Volts to about 24 Volts. The voltage on the source can float if the gate of the HV transistor is 0 Volts. A 3D NAND cell in the 3D NAND integrated circuit can be programmed (written), erased and read. During programming, a program voltage (Vprog) of about 20 Volts is applied to the selected word line and a pass voltage (Vpass) of about 10 Volts is applied to the unselected word lines. During a verify operation, a verify voltage (Vverify) of 0 Volts to about 5 Volts is applied to the selected word line and a pass voltage (Vpassr) of about 7V is applied to the unselected word lines. During initialization to discharge remaining charge in the 3D NAND cell, a initialization voltage (Vinit) is applied to the selected and unselected word lines.

Each NAND cell in the array of NAND cells is coupled to a global word line that is selectively coupled to one of a plurality high voltage (HV) transistors. As the number of global word lines increase, there is a corresponding increase in the number of high voltage transistors. The silicon area layout of the source and drain of each of the high voltage transistors is in symmetry and the size of the source and drain is dependent on the maximum voltage to be applied to source or the drain of any one of the plurality of HV transistors in the array of NAND cells. As the maximum voltage applied to the global word line to program NAND cells in the global word line can be a high voltage (Vprog) of about 20 Volts, the silicon area of the source and the silicon area of drain for all HV transistors in the NAND device is selected for a high voltage of about 20 Volts, that is, the silicon area of the source and the silicon area of the drain are symmetrical.

The total silicon area used by a plurality of high voltage transistors in an array of NAND cells is reduced by modifying the silicon area layout such that the silicon area of the source and the silicon area of the drain of each of the plurality of high voltage transistors is dependent on the maximum voltage to be applied to the source and drain for the respective one of the plurality of high voltage transistors.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Figure 1:
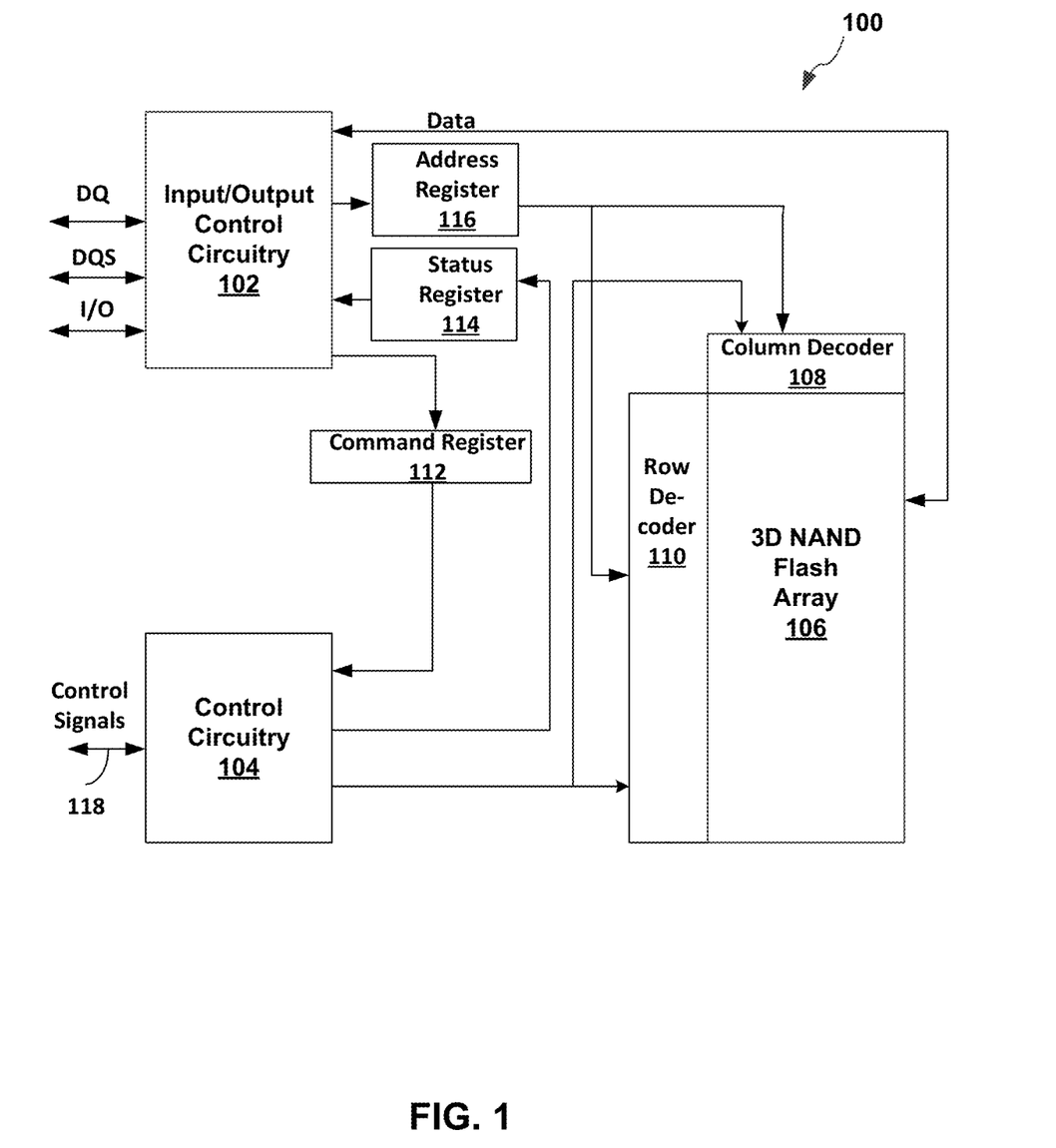
FIG. 1 is a block diagram of a 3D (Three-Dimensional) NAND Flash device.

FIG. 1 is a block diagram of a 3D (Three-Dimensional) NAND device 100. The 3D NAND device 100 includes Input/Output Control circuitry 102 and control circuitry 104 that are coupled to a host memory controller (not shown) via a plurality of control and data signals. The 3D NAND device 100 also includes a 3D NAND Flash array 106 that includes a plurality of NAND cells organized in rows and columns.

A row decoder 110 and a column decoder 108 are provided to decode address signals to access the 3D NAND Flash array 106. The 3D NAND device 100 further includes input/output (I/O) control circuitry 102 to manage input of commands, addresses, and data to the 3D NAND device 100 and the output of data and status information from the 3D NAND device 100. An address register 116 is in communication with I/O control circuitry 102, and row decoder 110 and column decoder 108, to latch the address signals prior to decoding. A command register 112 is in communication with I/O control circuitry 102 and control circuitry 104 to latch incoming commands.

Control circuitry 104 controls access to the 3D NAND Flash array 106 in response to the commands and generates status information. Control circuitry 104 is in communication with row decoder 110 and column decoder 108 to control the row decoder 110 and column decoder 108 in response to the addresses. Additionally, control circuitry 104 can issue erase commands that trigger activation of one or more high voltage transistors within row decoder 110 and column decoder 108.

In other examples, the one or more high-voltage transistors are located separately from row decoder 110 and column decoder 108, such as within the 3D NAND Flash array 106.

The Open NAND Flash Interface (ONFI) is a standard that defines the operation of the data bus and the control signals. The ONFI standard supports an 8-bit or 16-bit data bus (two independent 8-bit data buses) and up to four NAND die in a package.

The Input/Output Control circuitry 102 in the 3D NAND device 100 communicates with the host memory controller via a bidirectional data bus (DQ) and a bidirectional data strobe (DQS) signal. The DQS signal is used to indicate a data valid window. The control circuitry 104 in the 3D NAND device 100 receives control signals 118 from the host memory controller. The control signals 118 that are received include chip enable (CE#) to select the 3D NAND device 100 for data transfer with the host memory controller, Address Latch Enable (ALE) to indicate the type of bus cycle (command, address or data), Command Latch Enable (CLE) to indicate the type of bus cycle (command, address or data), Read Enable (RE#), Write Enable (WE#), and Write Protect (WP#) to disable program and erase operations. The 3D NAND device 100 also includes control signals 118 output by control circuitry 104 that include a Ready/Busy (R/B#) signal to indicate whether the 3D NAND device 100 is executing an operation ("busy") or is ready for a next operation.

It will be appreciated that the memory device of FIG. 1 may include additional circuitry and signals, and that the functional blocks of the memory device may not necessarily be segregated as shown in this example case. For example, a single component or component portion of an integrated circuit device could be adapted to perform the functionality of more than one block component of FIG. 1. Alternatively, or in addition, functionality of a single block component of FIG. 1 may be distributed into multiple blocks. Additionally, while specific I/O pins are described in accordance with popular conventions for receipt and output of the various signals, it is noted that other combinations or numbers of I/O pins may be used in the various embodiments. Many variations will be appreciated.

Figure 2:
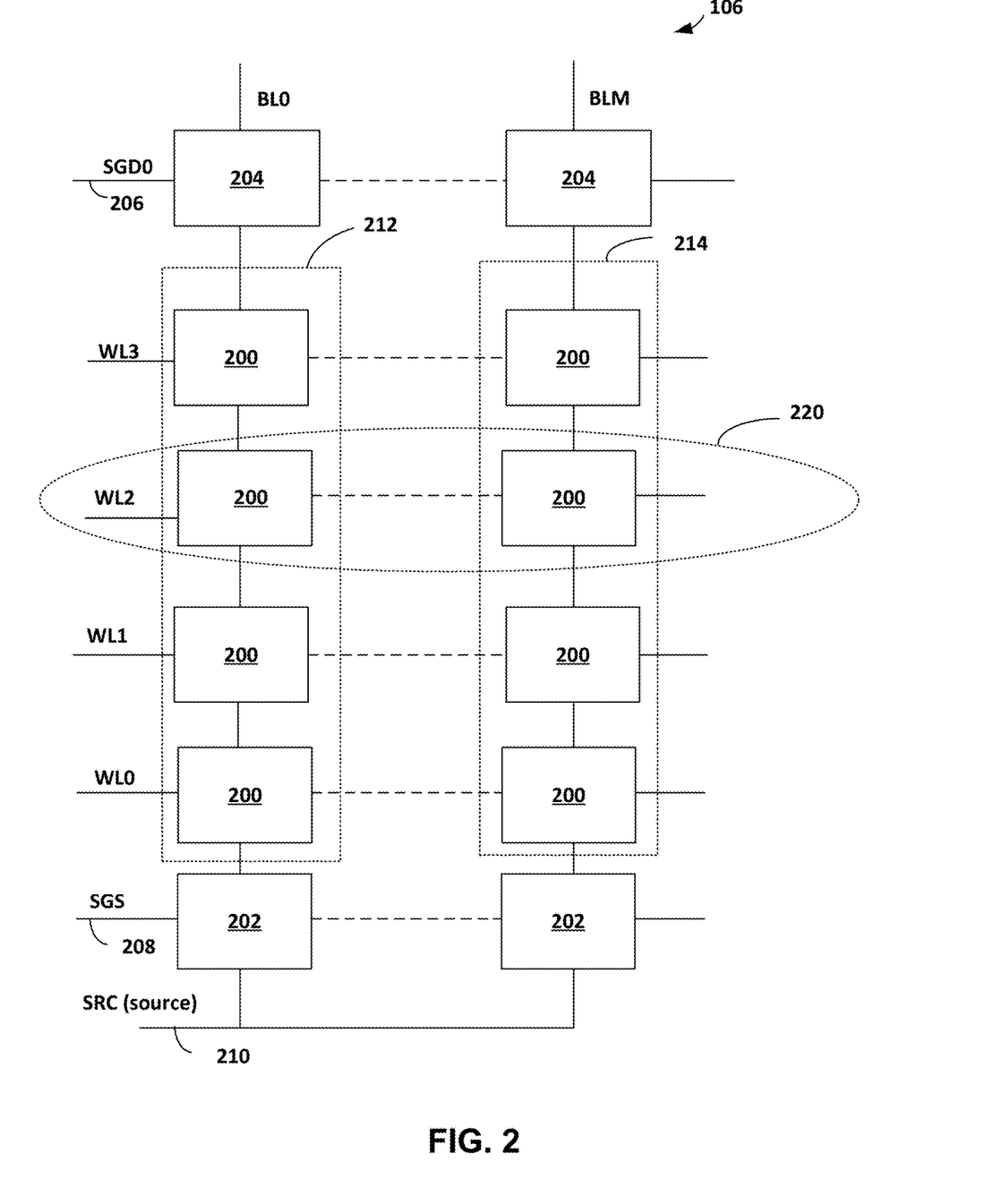
FIG. 2 is a block diagram illustrating a plurality of NAND cells in the 3D NAND Flash array shown in FIG. 1.

FIG. 2 is a block diagram illustrating a plurality of NAND cells in the 3D NAND Flash array 106 shown in FIG. 1. Each of the plurality of NAND cells 200 in the 3D NAND Flash array 106 is connected to a word line (WL) and a bit line (BL). A NAND cell 200 can be selected via the BL and the WL. Four word lines labeled W0-W3 and two bit lines labeled BL0, BLM are shown in FIG. 2.

In a 3D NAND Flash array 106 that includes QLC NAND cells, each NAND cell 200 can store four bits, one bit per page (upper, lower, extra, top). In a 3D NAND Flash array 106 that includes TLC NAND cells, each NAND cell 200 can store three bits, one bit per page (upper, lower, top). In a 3D NAND Flash array 106 that includes Penta-Level Cells (PLC) NAND cells, each NAND cell 200 can store five bits.

The plurality of NAND cells 200 are arranged in a two-dimensional (2D) array of strings and tiers. Two 2D array of string of NAND cells 212, 214 and four tiers WL0-WL3 are shown in FIG. 2. Each string of NAND cells 212, 214 is coupled to a source line (SRC) 210 using a respective source-side select gate (SGS) 208 and to a respective bit line BL0, BLM using a respective drain-side select gate (SGD). In the example shown there are 4 tiers, other examples can include strings of NAND cells having more or fewer tiers or bit lines.

The 3D NAND device 100 is divided into blocks with each block divided into pages. Each page comprises a plurality of NAND cells 200 that share a word line. As shown in FIG. 2, all of the NAND cells 200 in page 220 are coupled to WL2. A block includes the NAND strings that share the same group of word lines. The block is the smallest erasable unit of NAND cells in the 3D NAND device. In a block erase operation, a group of consecutive pages is erased in a particular operation. Erase operates on an entire block of NAND cells 200 and sets all the NAND cells in the block to a logical "1".

To program (write) data to a page 220, a program voltage (Vpgm) is applied to the selected word line (WL2) and thus, to a control gate of each NAND cell 200 coupled to the selected word line. While the program voltage (Vpgm) is applied to the selected word line, a potential, such as a ground potential, can be applied to the bit lines of the NAND cells 200 in the page 220, resulting in a charge transfer to a floating gate of each NAND cell 200 in the page 220. A pass voltage (Vpass) can be applied to one or more word lines (for example, WL3, WL1, WL0) in the block having NAND cells 200 that are not being programmed or a 2 Volts to about 3 Volts inhibit voltage can be applied to bit lines having NAND cells 200 that are not being programed to inhibit charge from being transferred to the floating gates of the NAND cells 200 that are not selected for programming.

To erase a block of NAND cells 200, a 18 Volts to about 20 Volts erasure voltage is applied between the sources and drains of the NAND cells 200 in the block using one or more bit lines and select gates while the word lines of the targeted NAND cells 200 are kept at a ground potential resulting in a charge transfer from the floating gates of the NAND cells in the block. An erase operation is the process of removing electrons from the floating gates to change the state of cell to logical "1". A large erasure voltage, for example, 20 Volts is required to repel the electrons from the floating gate.

Figure 3:
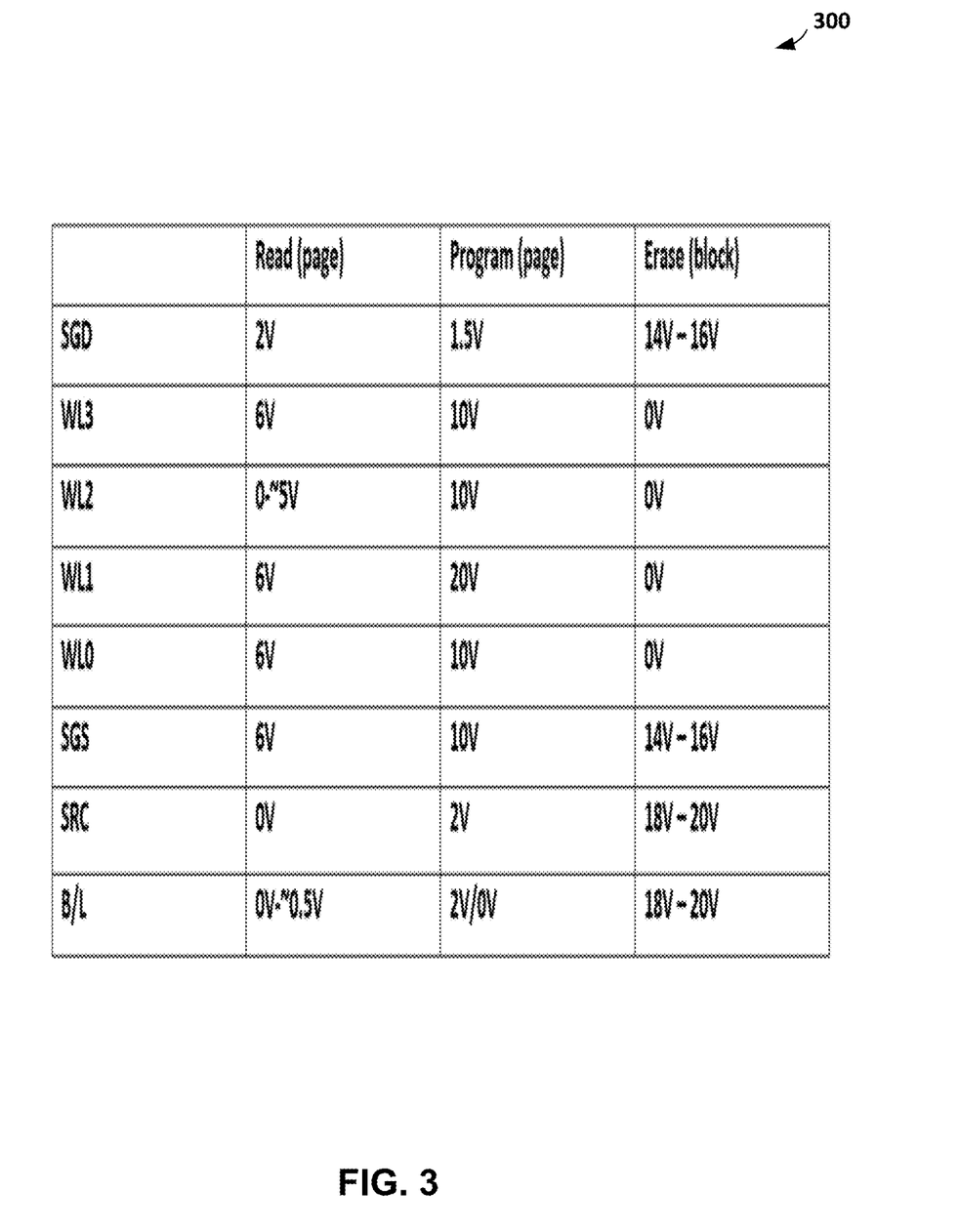
FIG. 3 is a table that illustrates an example of voltages applied to the signal lines shown in FIG. 2 to read and program a page of NAND cells, and to erase a block of NAND cells in the NAND Flash array shown in FIG. 1.

FIG. 3 is a table 300 that illustrates an example of voltages applied to the signal lines shown in FIG. 2 to read and program a page of NAND cells, and to erase a block of NAND cells in the 3D NAND Flash array 106 shown in FIG. 1.

The first column of the table 300 illustrates the voltages applied to the plurality of NAND cells 200 in the 3D NAND Flash array 106 shown in FIG. 2 to read a page, that is, the NAND cells 200 in Word Line 2 (WL2) 220. A 2V signal is applied to the drain-side select gate (SGD), a 6V signal is applied to the non-selected word lines WL3, WL1 and WL0, a 0 Volts to about 5 Volts signal is applied to the selected word line WL2, a 6V signal is applied to the source-side select gate (SGS) 202, a 0V signal is applied to the source line (SRC) 210 and a 0V to about 0.5V signal is applied to the bit line BL0, BLM.

The second column of the table 300 illustrates the voltages applied to the plurality of NAND cells 200 in the 3D NAND Flash array 106 shown in FIG. 2 to program a page, that is, to program the NAND cells 200 in Word Line 2 (WL2) 220. A 1.5V signal is applied to the drain-side select gate (SGD), a 10V signal is applied to the non-selected word lines WL3, WL1 and WL0, a 20V signal is applied to the selected word line WL2, a 6V signal is applied to the source-side select gate (SGS) 202, a 0V signal is applied to the source line (SRC) 210 and a 0V to 0.5V signal is applied to the bit line BL0, BLM.

The third column of the table 300 illustrates the voltages applied to the plurality of NAND cells 200 in the 3D NAND Flash array 106 shown in FIG. 2 to erase a block of NAND cells including the NAND cells 200 in Word Line 2 (WL2) 220. A 14V to 16V SRC-4V signal is applied to the drain-side select gate (SGD), a 0V signal is applied to all of the word lines WL3, WL1, WL2 and WL0 in a block of NAND cells, a 14V to 16V signal is applied to the source-side select gate (SGS) 202, a 18V to 20V voltage signal is applied to the source line (SRC) 210 and a SRC voltage signal is applied to the bit line BL0, BLM.

Figure 4:
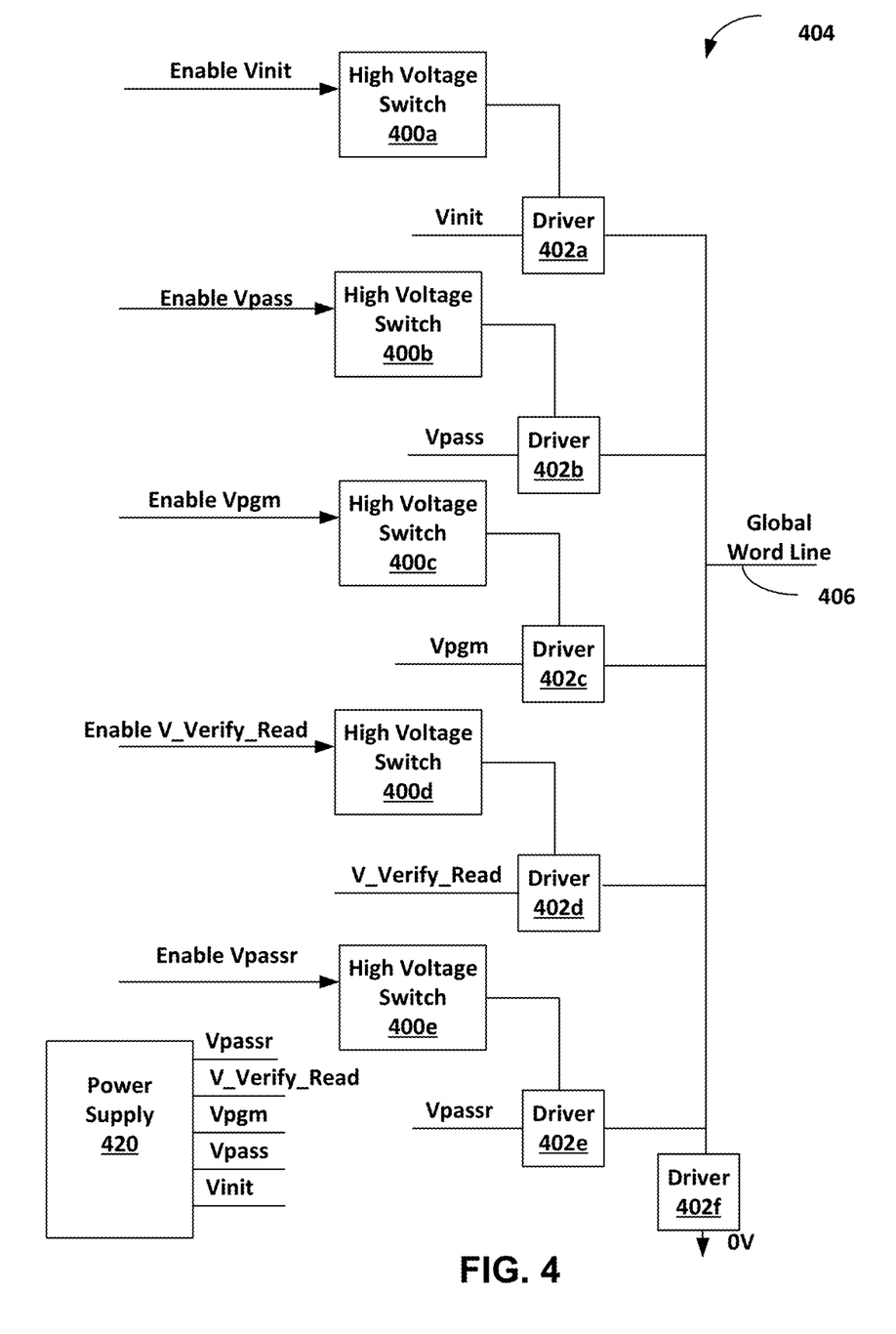
FIG. 4 is a block diagram of control circuitry to select one of a plurality of voltages from a power supply for a global word line.

FIG. 4 is a block diagram of control circuitry 404 to select one of a plurality of voltages from a power supply 420 for a global word line 406. The control circuitry includes a plurality of high voltage switches 400a-e and a plurality of global word line drivers 402a-e to enable one of the plurality of global word line drivers 402a-e to drive the selected voltage onto the global word line 406.

The selected voltage can be one of Vinit (an initialization voltage, for example, 2 Volts), Vpgm (a program voltage, for example, 20 Volts), Vpass (a pass gate voltage, for example, 7 Volts), V_Verify_Read (a verify read voltage, for example, 0-0.5V), or Vpassr (a pass gate read voltage, for example, 7 Volts).

The global word line 406 can be selectively coupled to multiple word lines in the 3D NAND Flash array 106.

Figure 5:
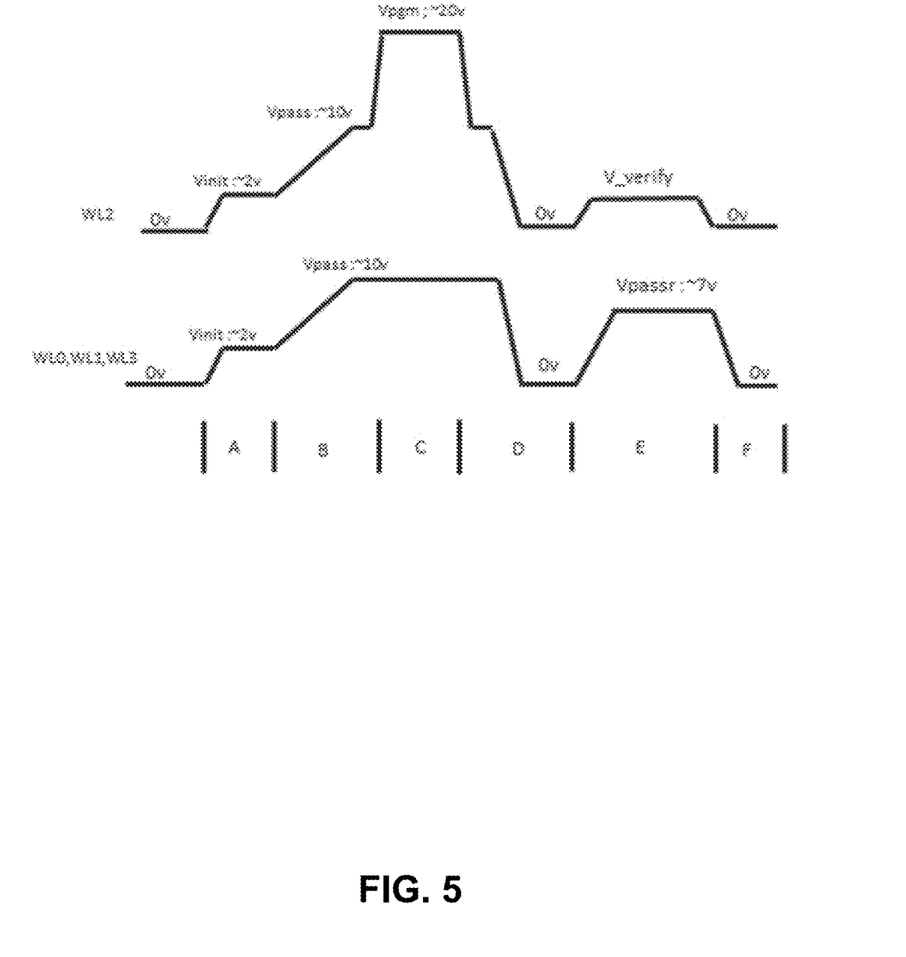
FIG. 5 is a timing diagram illustrating voltages selected by the control circuitry via the global word line for selected word line WL2 and non-selected word lines WL0, WL1, WL3 to program the selected word line WL2.

FIG. 5 is a timing diagram illustrating voltages selected by the control circuitry 404 via the global word line for selected word line WL2 and non-selected word lines WL0, WL1, WL3 to program the selected word line WL2.

Referring to FIG. 5, during time period A, an initialization voltage Vinit is applied to selected word line WL2 and unselected word lines WL0, WL1, WL3 to discharge remaining charge in the NAND cell channel.

During time period B, the voltage is slowly increased to a pass gate voltage Vpass on the selected word line WL2 and non-selected word lines WL0, WL1, WL3.

During time period C, the voltage applied to the selected word line WL2 is a program voltage Vpgm to program the NAND cells in the selected word line WL2 while the pass gate voltage Vpass continues to be applied to the non-selected word lines WL0, WL1, WL3.

During time period D, the program voltage Vpgm applied to selected word line WL2 and the pass gate voltage Vpass applied to the non-selected word lines WL0, WL1, WL3 is discharged.

During time period E, the programmed NAND cells in selected word line WL2 are verified by applying a verify read voltage V_Verify_Read to the selected word line WL2 while a pass gate read voltage Vpassr is applied to the non-selected word lines WL0, WL1, WL3.

During time period F, the verify read voltage V_Verify_Read applied to selected word line WL2 and the pass gate read voltage Vpassr applied to the non-selected word lines WL0, WL1, WL3 are discharged.

Figure 6:
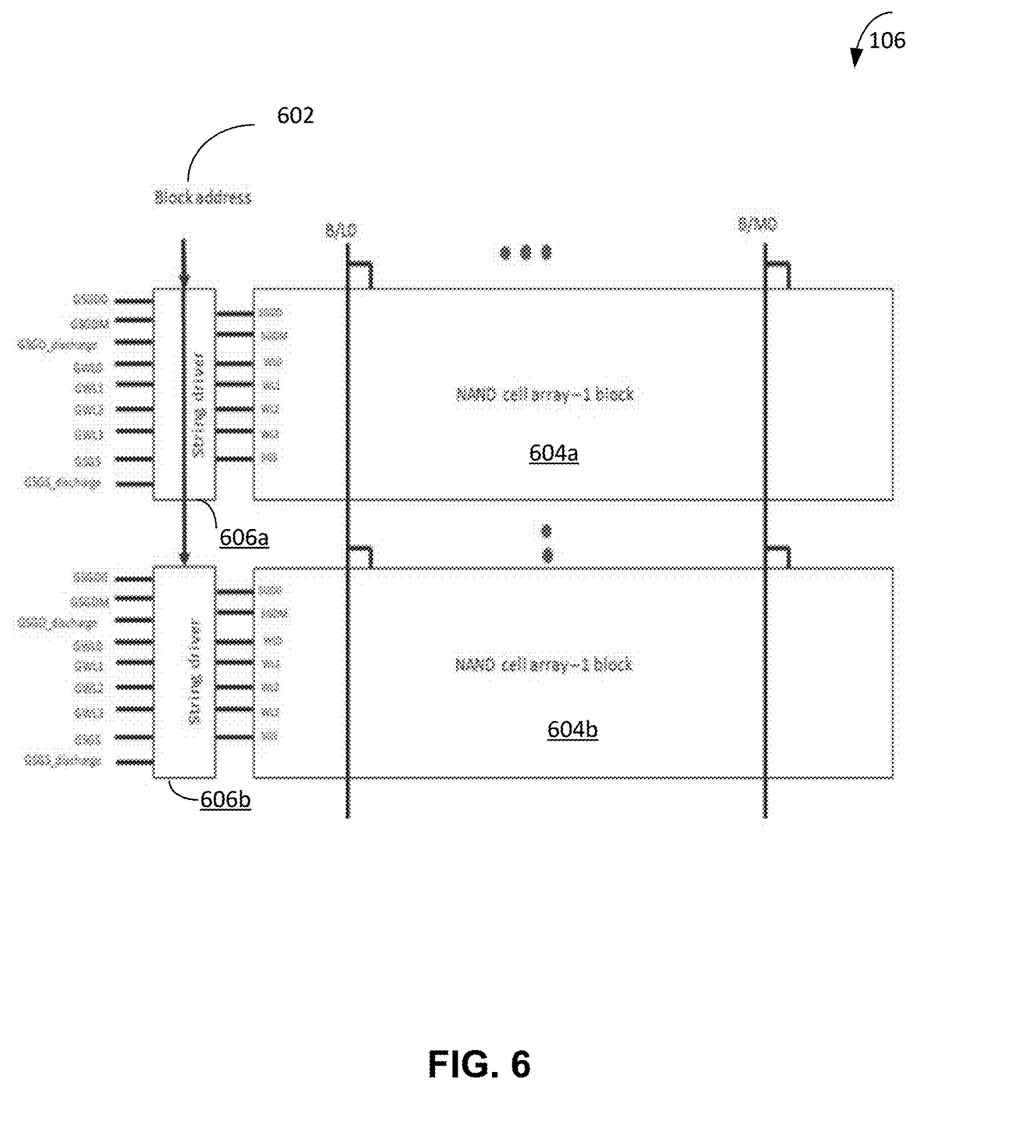
FIG. 6 is a block diagram illustrating blocks of NAND cells in the 3D NAND Flash array shown in FIG. 1.

FIG. 6 is a block diagram illustrating blocks of NAND cells in the 3D NAND Flash array 106 shown in FIG. 1. Each block of NAND cells 604a, 604b has a respective string driver 606a, 606b that includes switches that when enabled by the block address 602 allow the voltage applied to the global word lines to be applied to the respective word lines.

Figure 7:
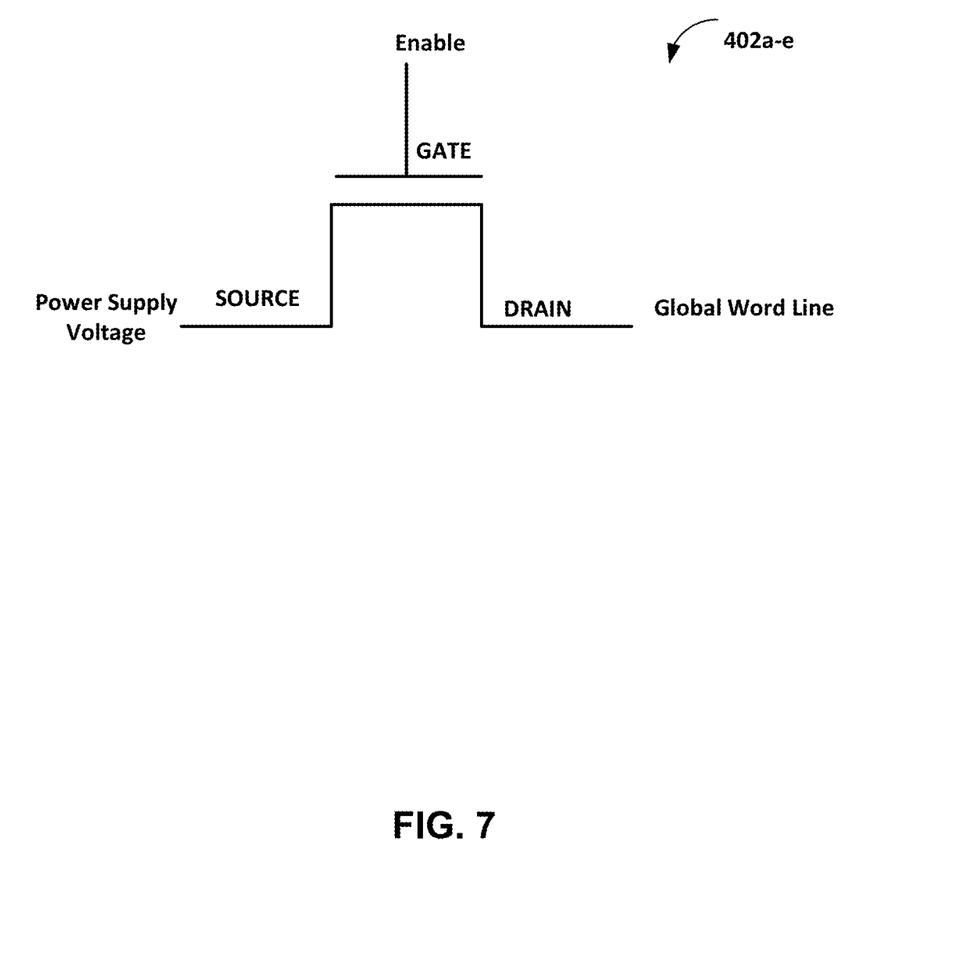
FIG. 7 is a circuit diagram of any one of the drivers shown in FIG. 4.

FIG. 7 is a circuit diagram of any one of the global word line drivers 402a-e shown in FIG. 4. Each of the drivers 402a-g includes a source, drain and gate. The gate is connected to the respective high voltage switch 400a-e, the drain is coupled to the Global word line 406 and the source is coupled to one of the plurality of voltage output signals from the power supply 420.

Figure 8:
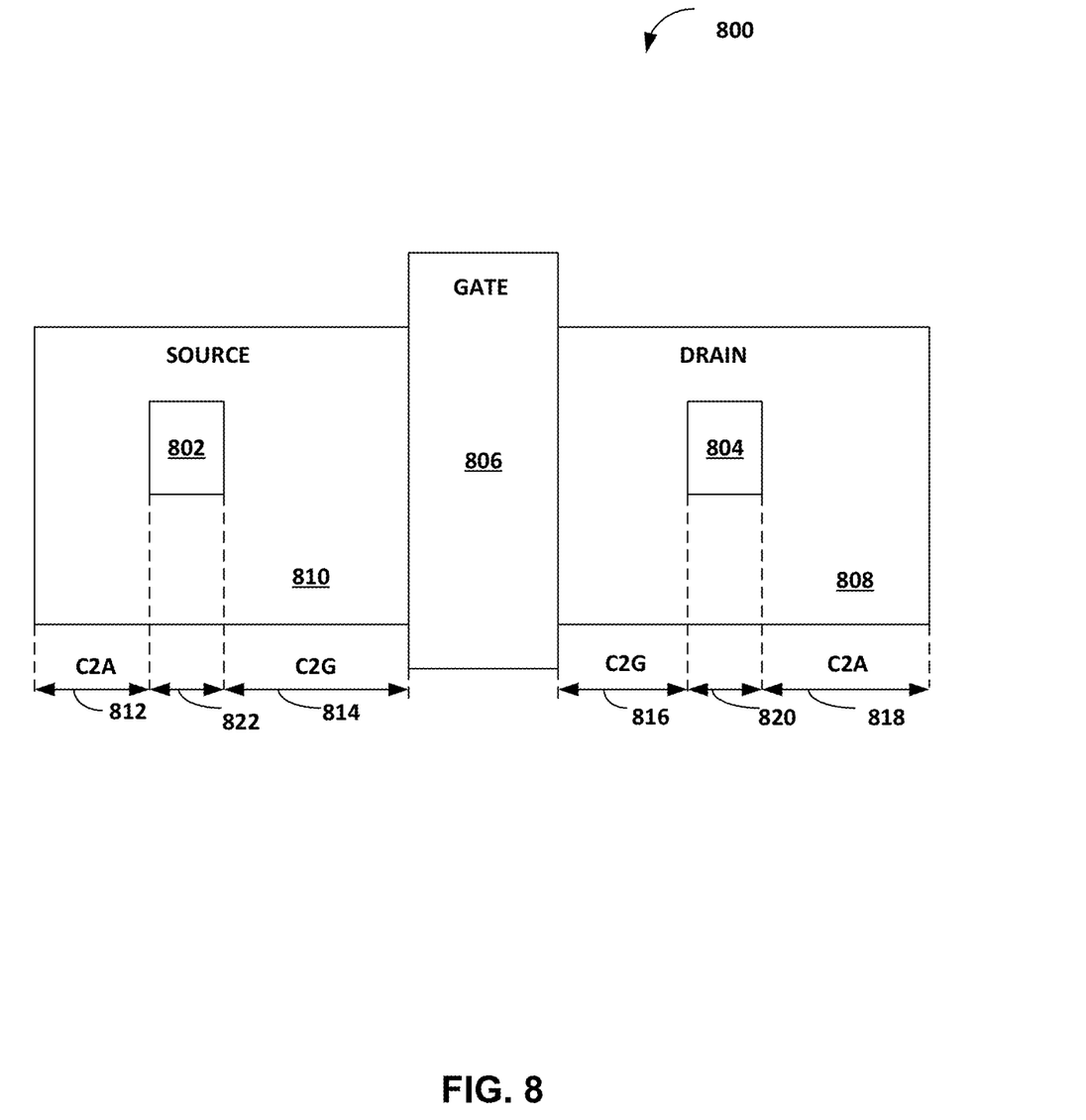
FIG. 8 is a layout of any one of the global word line drivers shown in FIG. 4.

FIG. 8 is a layout 800 of any one of the global word line drivers 402a-e shown in FIG. 4. The layout 800 of each of the global word line drivers 302a-e includes a source 810, a gate 806 and a drain 808. The source 810 has a source contact 802 and the drain 808 has a drain contact 804.

The total silicon area used by global word line drivers 402a-e is reduced by modifying the silicon area layout such that the area of the source 810 and drain 808 of each of the plurality of high voltage global word line drivers 402a-e is dependent on the maximum voltage to be applied to each of the source 810 and drain 808 for the respective one of the plurality of global word line drivers 402a-e. The global word line drivers 402a-e can also be referred to as high voltage transistors.

The silicon area of the source 810 is dependent on the length of the source contact 822, a contact to gate (C2G) length 814 and a contact to active (C2A) length 812. The source contact 802 is the contact to gate (C2G) length 814 from the gate 806 and the contact to active (C2A) length 812 from the non-gate side of the source contact 802.

The contact to gate (C2G) length 814 from the gate 806 and the contact to active (C2A) length 812 from the non-gate side of the source 810 is selected based on the maximum voltage to be applied to the source contact 802. In an embodiment, the contact to gate (C2G) length 814 from the gate 806 is X micron (micrometers, μm) and the contact to active (C2A) length 812 from the non-gate side of the source 810 is X/2 micron for the maximum voltage. In an embodiment, X is 2. In other embodiments, X can be 1 μm, 3 μm or 500 nanometers (nm).

The silicon area of the drain 808 is dependent on the length of the drain contact 820, a contact to gate (C2G) length 816 and a contact to active (C2A) length 818. The drain contact 804 is the contact to gate (C2G) length 816 from the gate 806 and the contact to active (C2A) length 818 from the non-gate side of the drain contact 804.

The contact to gate (C2G) length 816 from the gate 806 and the contact to active (C2A) length 818 from the non-gate side of the drain 808 is selected based on the maximum voltage to be applied to the drain contact 804. In an embodiment, the contact to gate (C2G) length 814 from the gate 806 is X micron and the contact to active (C2A) length 812 from the non-gate side of the source 810 is X/2 micron for the maximum voltage. In an embodiment, X is 2.

Referring to FIG. 4, in the global word line driver 402*c* the maximum voltage applied to the source contact 802 is 20V (the program voltage (Vpgm)) and the maximum voltage applied to the drain contact 804 is 20V (the program voltage (Vpgm)). The contact to gate (C2G) length 814 from the gate 806 is X μm and the contact to active (C2A) length 812 from the non-gate side of the source 810 is X/2 μm for the maximum voltage in the global word line driver 402*c*. The contact to gate (C2G) length 814 from the gate 806 is X (micron, micrometers)μm and the contact to active (C2A) length 812 from the non-gate side of the source 810 is X/2 μm in the global word line driver 402*c*.

In the other global word line drivers 402*a-b*, 402*d-e*, the maximum voltage applied to the drain contact 804 is 20V (the program voltage). The contact to gate (C2G) length 814 from the gate 806 is X (micron, micrometers) μm and the contact to active (C2A) length 812 from the non-gate side of the source 810 is X/2 μm in the global word line driver 402*c*.

In the other global word line drivers 402*a-b*, 402*d-e*, the maximum voltage applied to the source contact 802 is 10V or less than 10V. The maximum voltage is 10V (the pass voltage Vpass) to global word line driver 402*b*, 2V (the initialization voltage Vinit) to global word line driver 402*a*, 0V to 5V (the verify voltage) to global word line driver 402*d* and 7V (Vpassr) to global word line driver 402*e*. The contact to gate (C2G) length 814 from the gate 806 is X/2 μm and the contact to active (C2A) length 812 from the non-gate side of the source 810 is X/4 μm for the 10V or less than 10V in the global word line drivers 402*a-b*, 402*d-e*.

Instead of selecting the same C2G and C2A length (and silicon area) for both the source 810 and the drain 808 based on the maximum voltage applied to either the source contact 802 or the drain contact 804, the source C2G and C2A length (and silicon area) is based on the maximum source voltage applied to the source contact 802 and the drain C2G and C2A length is based on maximum drain voltage applied to the drain contact 804. This results in a reduction of silicon area for global word line drivers that do not have the same value for the drain maximum voltage and the source maximum voltage.

In other embodiments, the silicon area for the drain and source can be decreased further when the maximum voltage is 2V (for example, global word line driver 402*b*) or 7V (for example, global word line driver 402*e*).

Figure 9:
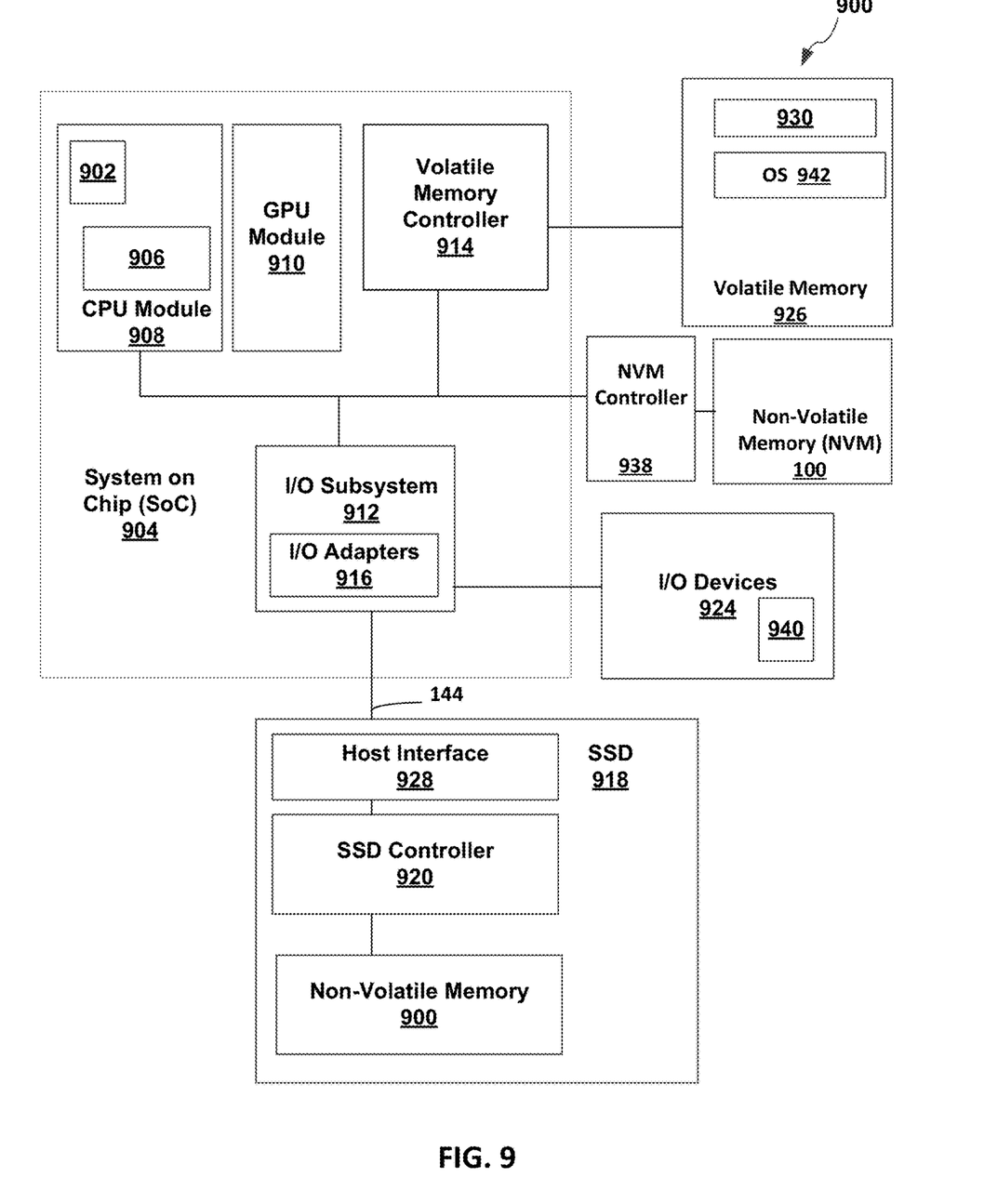
FIG. 9 is a block diagram of a computer system that includes non-volatile memory.

FIG. 9 is a block diagram of a computer system 900 that includes 3D NAND device 100. Computer system 900 can correspond to a computing device including, but not limited to, a server, a workstation computer, a desktop computer, a laptop computer, and/or a tablet computer.

The computer system 900 includes a system on chip (SOC or SoC) 904 which combines processor, graphics, memory, and Input/Output (I/O) control logic into one SoC package. The SoC 904 includes at least one Central Processing Unit (CPU) module 908, a volatile memory controller 914, and a Graphics Processor Unit (GPU) 910. In other embodiments, the volatile memory controller 914 can be external to the SoC 904. Although not shown, each of the processor core(s) 902 can internally include one or more instruction/data caches, execution units, prefetch buffers, instruction queues, branch address calculation units, instruction decoders, floating point units, retirement units, etc. The CPU module 908 can correspond to a single core or a multi-core general purpose processor, such as those provided by Intel® Corporation, according to one embodiment.

The Graphics Processor Unit (GPU) 910 can include one or more GPU cores and a GPU cache which can store graphics related data for the GPU core. The GPU core can internally include one or more execution units and one or more instruction and data caches. Additionally, the Graphics Processor Unit (GPU) 910 can contain other graphics logic units that are not shown in FIG. 9, such as one or more vertex processing units, rasterization units, media processing units, and codecs.

Within the I/O subsystem 912, one or more I/O adapter(s) 916 are present to translate a host communication protocol utilized within the processor core(s) 902 to a protocol compatible with particular I/O devices. Some of the protocols that adapters can be utilized for translation include Peripheral Component Interconnect (PCI)-Express (PCIe); Universal Serial Bus (USB); Serial Advanced Technology Attachment (SATA) and Institute of Electrical and Electronics Engineers (IEEE) 1594 "Firewire".

The I/O adapter(s) 916 can communicate with external I/O devices 924 which can include, for example, user interface device(s) including a display and/or a touch-screen display 940, printer, keypad, keyboard, communication logic, wired and/or wireless, storage device(s) including hard disk drives ("HDD"), solid-state drives ("SSD") 918, removable storage media, Digital Video Disk (DVD) drive, Compact Disk (CD) drive, Redundant Array of Independent Disks (RAID), tape drive or other storage device. The storage devices can be communicatively and/or physically coupled together through one or more buses using one or more of a variety of protocols including, but not limited to, SAS (Serial Attached SCSI (Small Computer System Interface)), PCIe (Peripheral Component Interconnect Express), NVMe (Non-Volatile Memory Express) over PCIe (Peripheral Component Interconnect Express), and SATA (Serial ATA (Advanced Technology Attachment)).

Additionally, there can be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols; and cellular protocols.

The I/O adapter(s) 916 can also communicate with a storage device, that can be a hard disk drive (HDD) or a solid-state drive ("SSD") 918 which includes a SSD controller 920, a host interface 928 and a 3D NAND device 100. The solid state drive 918 can also include a pseudo non-volatile memory buffer 950 that can be a volatile memory that retains data for a period of time after a loss of power through the use of a supercapacitor.

The computer system 900 can include a 3D NAND device 100 and a non-volatile memory controller 938 communicatively coupled to the CPU module 908 in the SoC 904. The 3D NAND device 100 can be included in a dual in-line memory module (DIMM) that can be referred to as a non-volatile dual in-line memory module (NVDIMM).

A non-volatile memory (NVM) device is a memory whose state is determinate even if power is interrupted to the device. In one embodiment, the NVM device can comprise a block addressable memory device, such as NAND technologies, or more specifically, multi-threshold level NAND Flash memory (for example, Single-Level Cell ("SLC"), Multi-Level Cell ("MLC"), Quad-Level Cell ("QLC"), Tri-Level Cell ("TLC"), or some other NAND). A NVM device can also include a byte-addressable write-in-place three dimensional crosspoint memory device, or other byte addressable write-in-place memory (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

The I/O adapters 916 can include a Peripheral Component Interconnect Express (PCIe) adapter that is communicatively coupled using the NVMe (NVM Express) over PCIe (Peripheral Component Interconnect Express) protocol over bus 944 to a host interface 928 in the solid state drive 918. Non-Volatile Memory Express (NVMe) standards define a register level interface for host software to communicate with a non-volatile memory subsystem (for example, a Solid-state Drive (SSD)) over Peripheral Component Interconnect Express (PCIe), a high-speed serial computer expansion bus). The NVM Express standards are available at www.nvmexpress.org. The PCIe standards are available at www.pcisig.com.

Applications 930 and an operating system (OS) 942 can be stored in volatile memory 926. Volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein can be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, DDR5 (DDR version 5, currently in discussion by JEDEC), LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

An operating system 942 is software that manages computer hardware and software including memory allocation and access to I/O devices. Examples of operating systems include Microsoft® Windows®, Linux®, iOS® and Android®.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope.

Therefore, the illustrations and examples herein should be construed in an illustrative, and not a restrictive sense. The scope of the invention should be measured solely by reference to the claims that follow.

What is claimed is:

1. A non-volatile memory device comprising:

a memory array, the memory array including a plurality of global word lines; and a plurality of high voltage transistors to couple to one of the plurality of global word lines, the high voltage transistor including a gate, a source and a drain, the drain coupled to the one of the plurality of global word lines, a source silicon area dependent on a maximum source voltage applied to the source and a drain silicon area dependent on a maximum drain voltage applied to the drain, the drain includes a drain contact and the source includes a source contact, a source Contact to Gate (C2G) length dependent on a maximum source voltage applied to the source contact and a drain C2G length dependent on a maximum drain voltage applied to the drain contact, a source Contact to Active (C2A) length dependent on a maximum source voltage applied to the source contact and a drain C2A length dependent on a maximum drain voltage applied to the drain contact.

2. The non-volatile memory device of claim 1, wherein the maximum source voltage is less than the maximum drain voltage and the source C2G length is smaller than the drain C2G length.

3. The non-volatile memory device of claim 2, wherein the maximum source voltage is 10 Volts or less, the maximum drain voltage is 20 Volts, the drain C2G length is x micron and the source C2G length is x/2 micron.

4. The non-volatile memory device of claim 3, wherein x is 2.

5. The non-volatile memory device of claim 1, wherein the maximum source voltage is 20 Volts, the maximum drain voltage is 20 Volts, the drain C2G length is x micron and the source C2G length is x micron.

6. The non-volatile memory device of claim 1, wherein the maximum source voltage is less than the maximum drain voltage and the source C2A length is smaller than the drain C2A length.

7. The non-volatile memory device of claim 1, wherein the memory array includes a plurality of Three Dimensional (3D) NAND cells.

8. A system comprising:

a memory controller; and a non-volatile memory device coupled with the memory controller, the non-volatile memory device comprising:

a memory array, the memory array including a plurality of global word lines; and a plurality of high voltage transistors to couple to one of the plurality of global word lines, the high voltage transistor including a gate, a source and a drain, the drain coupled to the one of the plurality of global word lines, a source silicon area dependent on a maximum source voltage applied to the source and a drain silicon area dependent on a maximum drain voltage applied to the drain, the drain includes a drain contact and the source includes a source contact, a source Contact to Gate (C2G) length dependent on a maximum source voltage applied to the source contact and a drain C2G length dependent on a maximum drain voltage applied to the drain contact, a source Contact to Active (C2A) length dependent on a maximum source voltage applied to the source contact and a drain C2A length dependent on a maximum drain voltage applied to the drain contact.

9. The system of claim 8, further comprising:

one or more of:

a processor, a power supply, and a display coupled with the non-volatile memory device.

10. The system of claim 8, wherein the maximum source voltage is less than the maximum drain voltage and the source C2G length is smaller than the drain C2G length.

11. The system of claim 10, wherein the maximum source voltage is 10 Volts or less, the maximum drain voltage is 20 Volts, the drain C2G length is x micron and the source C2G length is x/2 micron.

12. The system of claim 10, wherein x is 2.

13. The system of claim 8, wherein the maximum source voltage is 20 Volts, the maximum drain voltage is 20 Volts, the drain C2G length is x micron and the source C2G length is x micron.

14. The system of claim 8, wherein the maximum source voltage is less than the maximum drain voltage and the source C2A length is smaller than the drain C2A length.

15. The system of claim 8, wherein the memory array includes a plurality of Three Dimensional (3D) NAND cells.

* * * * *